United States Patent [19]
Tsuruta et al.

[11] Patent Number: 5,233,180
[45] Date of Patent: Aug. 3, 1993

[54] LIGHT SENSOR HAVING AN INTEGRATION CIRCUIT

[75] Inventors: Yoshio Tsuruta; Shotaro Yokoyama; Takashi Nishibe, all of Kawasaki, Japan

[73] Assignee: Fuji Electric Co., Ltd., Kawasaki, Japan

[21] Appl. No.: 889,712

[22] Filed: May 28, 1992

Related U.S. Application Data

[63] Continuation-in-part of Ser. No. 750,638, Aug. 27, 1991, Pat. No. 5,198,660.

[30] Foreign Application Priority Data

| Aug. 30, 1990 | [JP] | Japan | 2-230289 |
| Dec. 3, 1990 | [JP] | Japan | 2-400175 |
| Mar. 13, 1991 | [JP] | Japan | 3-48157 |
| May 31, 1991 | [JP] | Japan | 3-129477 |
| Dec. 10, 1991 | [JP] | Japan | 3-326193 |

[51] Int. Cl.$^5$ .......................... H01J 40/14
[52] U.S. Cl. ...................... 250/208.1; 250/214 A
[58] Field of Search .......... 250/214 A, 214 R, 211 J, 250/211 R, 208.1; 307/311, 494

[56] References Cited

U.S. PATENT DOCUMENTS

| 4,165,471 | 8/1979 | Ahrenkeil | 307/311 |
| 4,459,475 | 7/1984 | Flint et al. | 250/214 A |
| 4,789,777 | 12/1988 | Takami et al. | 250/214 A |

*Primary Examiner*—David C. Nelms
*Assistant Examiner*—K. Shami
*Attorney, Agent, or Firm*—Spencer, Frank & Schneider

[57] ABSTRACT

A light sensor device which uses semiconductors, can assure linearity even with low light intensity, and has a fast response time provides a voltage output proportional to a photoelectric current obtained from the output of an operational amplifier by accumulating the photoelectric current from a photodiode using the operational amplifier and an integration capacitance connected in parallel to the operational amplifier.

12 Claims, 13 Drawing Sheets

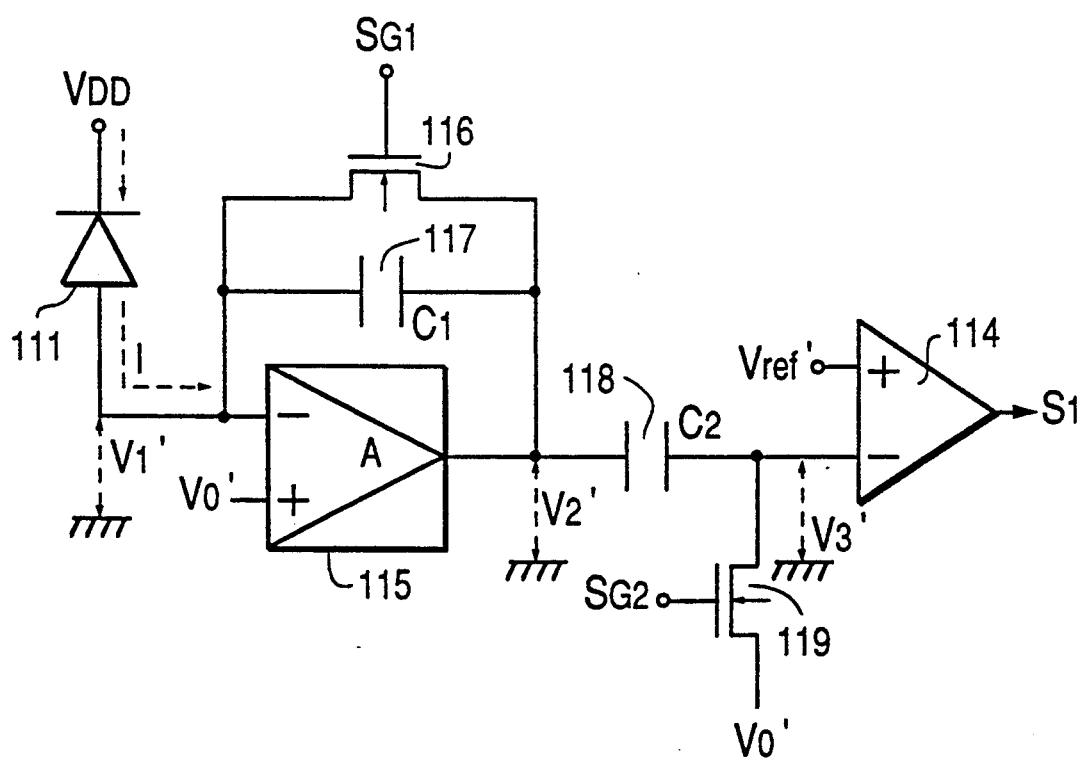
FIG. 1.1

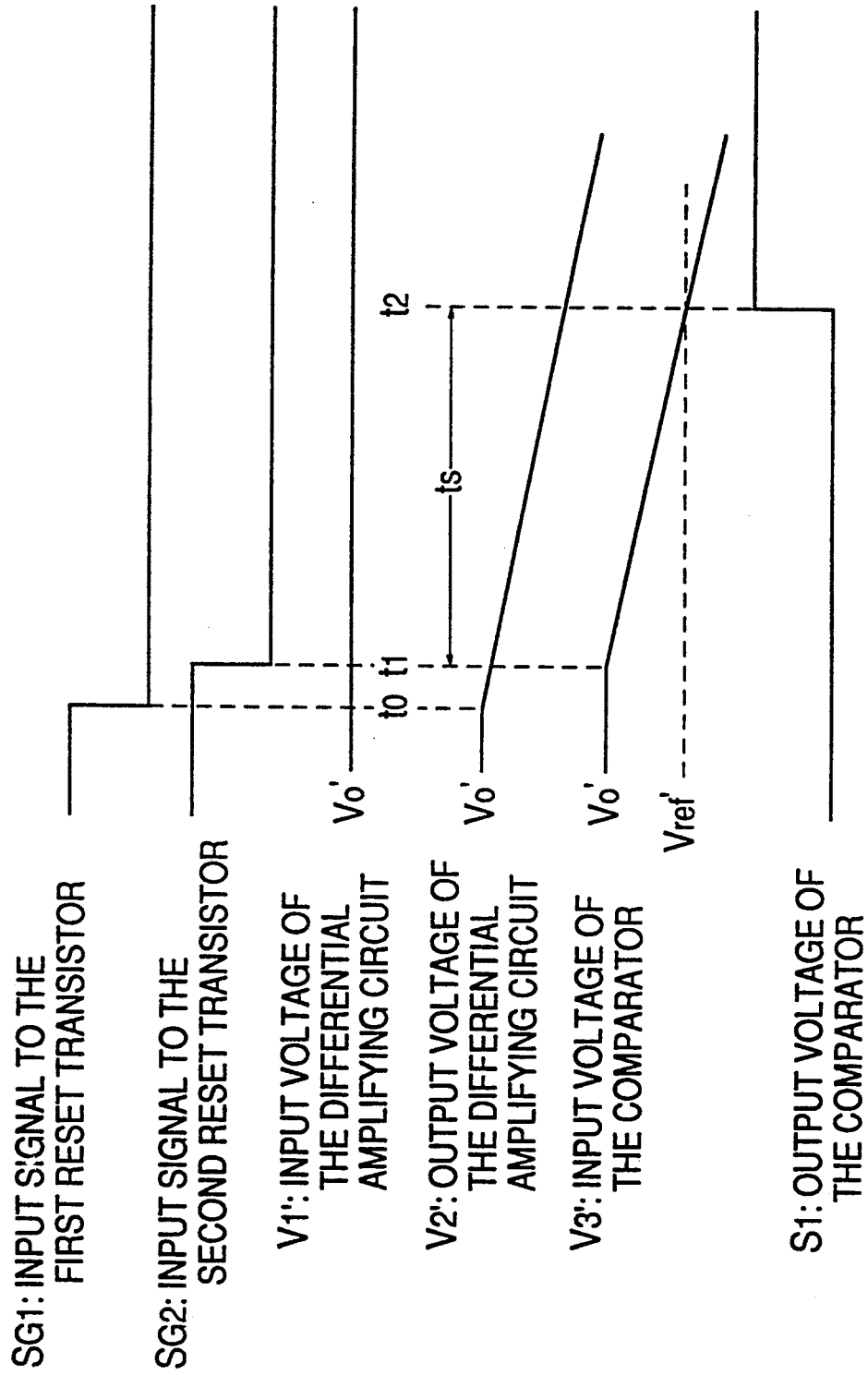

LIGHT SENSOR HAVING AN INTEGRATION CIRCUIT

CROSS-REFERENCE TO RELATED APPLICATIONS

The present application is a continuation in part of co-pending U.S. application Ser. No. 07/750,638, now U.S. Pat. No. 5,198,660 filed Aug. 27th, 1991, and incorporated herein by reference.

BACKGROUND OF THE INVENTION

1. Field of the Invention

The invention relates to the field of semiconductor light sensors which detect light intensity by producing a current which is thereafter converted into a voltage, and to devices using these sensors. More particularly, it relates to a semiconductor light sensor having particular use in automatic focussing cameras or in photoelectric transfer elements used in manuscript read-out devices, such as are installed in facsimile machines.

2. Background Information

Semiconductor light sensors are particularly useful in applications requiring compact size and/or low energy consumption. Manuscript read-out devices conventionally used in facsimile machines are of two system types: a reduction type, in which images from the manuscript are reduced and formed; and a contact type, in which manuscript images are read in their original size.

Contact-type read-out devices have been developed in recent years because they permit a machine to be made more compact and its light system easier to adjust. Light sensors used in these devices include thin film amorphous silicon, CdS-Se, monosilicon crystals of the charge-coupling device (CCD) type, and MOS type sensors. Sensors employing monosilicon crystals use high-performance elements such as photodiodes and phototransistors as photoelectric elements. A MOS-type light sensor using phototransistors can attain high performance at a relatively low cost, and is widely used in practice.

FIG. 14 shows an example of a conventional MOS-type light sensor device. This device comprises many phototransistor sensors (20.1–20.n), each phototransistor having a base-collector capacitance (22.1–22.n), switches (21.1–21.n) to read out signals from each sensor on an output line, and a reset switch (24) to reset each sensor and the device output. When the reset switch (24) and the switches (21.1–21.n) are turned on (closed), each sensor is reset. In this condition, the base-collector capacitance (22.1–22.n) of each sensor builds up a reverse bias voltage. After resetting, the switches are turned off (open). When the phototransistor sensors (20.1–20.n) are exposed to light, an electric charge develops according to the intensity of light impinging therefrom, and the charge is retained in the base-collector capacitances (22.1–22.n). Then, the switches (21.1–21.n) are turned on and off (closed and opened) sequentially according to the signal (25) received from a scanning circuit to read-out each sensor in turn. Since the base-collector capacitances (22.1–22.n) are recharged at this time, a current flows between the base and emitter. Moreover, a current multiplied by $h_{fe}$ (common emitter current gain) flows between the emitter and collector. Thus, the light detected by each sensor is converted into a current which is amplified and appears on the output line.

The above-described light sensor device using phototransistors provides an output with high sensitivity as a result of the amplification by the phototransistors. However, as shown in FIG. 15, it becomes difficult to maintain a flow of the base-to-emitter current IBE if the potential difference VBE between the base and emitter is small when the phototransistors deliver their output. Therefore, a current corresponding to the charge discharged from the base-collector capacitance (22) cannot flow between the base and emitter during a read-out time of from several hundred nano-seconds to several micro-seconds if the light intensity incident on the sensor is small. The output of the light sensor decreases sharply in the region of low incident light intensity as shown in section IX of FIG. 16. The linearity of the photoelectric transfer characteristic is lost making it difficult to obtain a high-sensitivity phototransistor sensor.

It is possible to maintain the linearity in the photoelectric transfer characteristics by prolonging the read-out time. However, this in turn increases the time required to read a manuscript, thereby reducing overall device speed.

SUMMARY OF THE INVENTION

According to the present invention, the above-described drawbacks and limitations are overcome by providing a light sensor with linear photoelectric transfer characteristics maintained in a region with low light intensity thereby enabling a manuscript to be read out in a short time.

In order to solve the above-mentioned problems, the light sensor according to the present invention has a photoelectric transfer means that generates a charge depending on the light intensity, and uses the potential variation resulting from the accumulation of this charge for a certain duration as a light output potential integration signal. The light sensor according to the present invention has a photoelectric transfer means to generate a charge according to the light intensity, an integration means to output the potential variation (during which the charge is accumulated for a certain duration) as a light output potential integration signal, a potential setting means to initialize this light output potential integration signal, and is equipped with a differential amplification circuit, in which the integration means operates with a predetermined reference voltage using the output from the photoelectric transfer means as an input, and an integration capacitance connected in parallel across the input and output of the differential amplification circuit. The photoelectric transfer means may comprise photodiodes.

In addition, the differential amplification circuit may consist of a circuit that uses CMOS devices. Furthermore, the differential amplification circuit should preferably be a comparison circuit (comparator) consisting of CMOS transistors. The potential setting means may have a switch circuit connected in parallel across the input and output of the differential amplification circuit.

Furthermore, a light sensor device which has many of the aforementioned light sensors includes a buffer circuit, into which the light output potential integration signal is input sequentially from each of the light sensors, the buffer circuit preferably including an output FET, the light output potential integration signal being applied to the gate electrodes thereof. It is also advantageous for the buffer circuit to be provided with a transfer capacitance into which the light output potential integration signal can be input, and a transfer potential initializing means to initialize a transfer potential generated at the output of this transfer capacitance. This transfer potential initializing means should preferably be equipped with a potential transfer converting and initializing means for initializing the transfer potential prior to initializing the light output potential integration signal. Furthermore, it is advantageous for the transfer potential initializing means to use a threshold potential setting means for initializing the transfer potential to a threshold potential in an output FET. This threshold potential setting means can use a potential setting FET with the same configuration as for the output FET.

Moreover, it is advantageous for the drain and gate electrodes in this potential setting FET to be used in a short-circuited state.

If an output FET is provided, it is advantageous for an output potential resetting means to be provided to initialize the potential on the output side of the output FET. Furthermore, the output end of the output FET should preferably be provided with a switching means to interrupt the current passing therethrough when the output potential resetting means is operating.

In a light sensor according to the present invention, the charge generated by the photoelectric transfer means according to the light intensity is fed to the input side of the differential amplification circuit, which is the integration means, and is accumulated in the integration capacitance connected in parallel with the differential amplification circuit. As a result, the potential on the input side of the differential amplification circuit is kept constant, while the potential on the output side changes. This change is then amplified and output from the differential amplification circuit. Since in the light sensor of the present invention the signal from the photoelectric transfer means is converted into voltage using the above-mentioned integration means, it is possible to adopt a photoelectric transfer means by which linearity is maintained even in a region of operation with low incident light intensity.

Furthermore, when a signal is read out from a sensor of the present invention, it is read out in such a way that the charge from the photoelectric transfer means is retained in the integration capacitance. Hence, the signal corresponding to the detected light is not destroyed.

Therefore, it is possible to read out the signal repeatedly from the sensor of the present invention.

In addition, since the output voltage from a light sensor of the present invention depends upon the value of the integration capacitance, the sensor sensitivity can be thereby easily adjusted. Also, since the charge from the photoelectric transfer means is converted into a voltage variation in the differential amplification circuit, the deviation in the junction capacitance inherent to each photoelectric transfer means, or the influence on the sensor output attributable to the deviation in the individual wiring capacitance, is suppressed.

Using many such light sensors makes it possible to construct a light sensor device with excellent linearity, such as for use in a facsimile machine. Moreover, in the buffer circuit, where the light output potential integration signals are sequentially input from the light sensors, a source follower can be attached by using an output FET, the light output potential integration signal being applied to the gate electrode thereof.

In a light sensor device of this type using many light sensors with the differential amplification circuit, more accurate information can be obtained by removing the influence of the offset potential inherent in a differential amplifier. For this purpose, transfer capacitances may be inserted into the output side of each light sensor. Nevertheless, the device construction can be simplified by installing the transfer capacitances in the buffer circuit into which the light output potential integration signals are input sequentially from the light sensors. Furthermore, by keeping these transfer capacitances initialized prior to initializing the light output potential integration signals from each light sensor, the potential variation to initialize the light output potential integration signals from each light sensor can be transferred. As a result, a light output potential integration signal is output at a high level when the light intensity from the light sensors is low, and this signal is converted by the transfer capacitance, which outputs a transfer potential that becomes a high-level potential when the light intensity is high. Therefore, the output from the light sensor device according to the present invention becomes even more accurate because of this transfer capacitance, and at the same time, it becomes possible to provide output with the same characteristics as those exhibited by conventional light sensor devices. If a source follower using an output FET is provided, it is possible to advantageously use the potential difference that can be output from the output FET by initially setting the transfer potential from the transfer capacitance to the threshold potential of the output FET.

If the output FET is provided as a source follower to reduce the load to the differential amplification circuit, mixing with an output from other light sensors can be avoided by resetting the potential at the output end of the output FET after the output from each light sensor has been transferred. In this resetting, the light output potential integration signal, or the transfer potential applied to the output FET, may be made a voltage lower than the threshold voltage to prevent the flow of a through current. Disposing a switching means to prevent such through current from flowing may shorten the time required to recharge the current path to which the voltage is applied, thus enabling operation at a higher speed.

These and other objects and aspects of the invention are better understood with reference to the detailed description and accompanying drawings, and it will be understood that changes in the specific structure shown and described may be made within the scope of the claims without departing from the spirit of the invention.

BRIEF DESCRIPTION OF THE DRAWINGS

Explanations are provided for the preferred embodiments of the present invention with reference to the drawings in which:

FIG. 1.1 is a circuit diagram showing an alternate embodiment of the light sensor device;

FIG. 2.1 is a timing chart that illustrates the operation of the device shown in FIG. 1.1;

DETAILED DESCRIPTION OF THE PREFERRED EMBODIMENTS

The invention will now be described in more detail by example with reference to the embodiments shown in the Figures. It should be kept in mind that the following description of the preferred embodiments is only presented by way of example and should not be construed as limiting the inventive concept to any particular physical configuration.

EMBODIMENT 1

Figure 1:
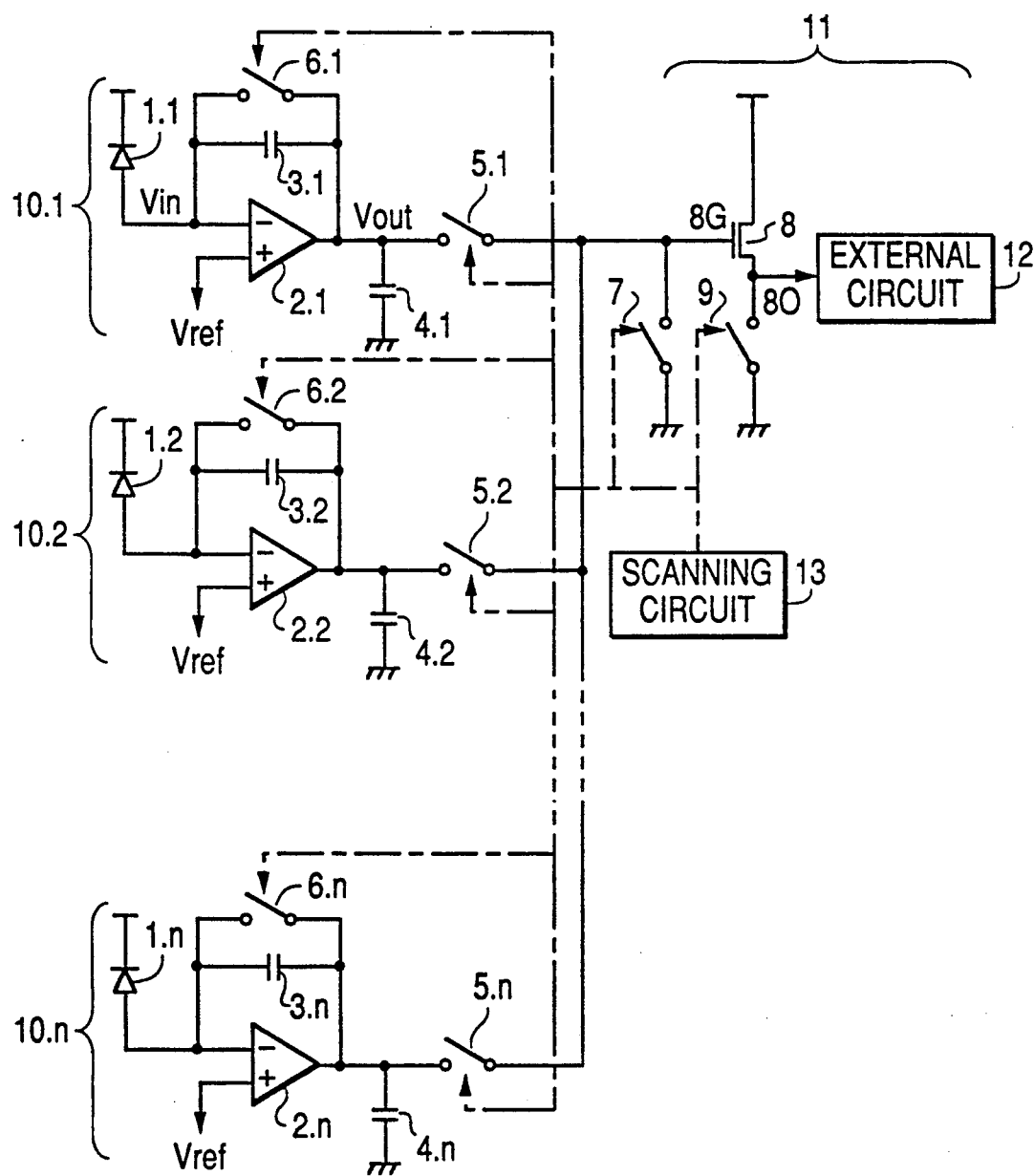
FIG. 1 is a circuit diagram showing the circuitry of the light sensor device according to Embodiment 1 of the present invention.

FIG. 1 shows the circuitry of the light sensor device according to a first embodiment of the present invention. The sensor device of this example comprises "n" light sensors (10.1–10.n). An individual light sensor (e.g., 10.n) comprises a photodiode (1.n), an operational amplifier (2.n), the output of the photodiode (1.n) being input into the inverting input and the reference voltage $V_{ref}$ being input into the noninverting input, an integration capacitance (3.n) and a resetting switch (6.n) connected to the outputs of the photodiode (1.n) and the operational amplifier (2.n), as well as a capacitor (4.n) and an output switch (5.n) connected to the output of the operational amplifier (2.n).

In this circuit, the cathode electrode of the photodiode (1.n) is connected to a power source voltage, while the anode electrode of the photodiode (1.n) is connected to the inverting terminal of the operational amplifier (2.n). The resetting switch (6.n) may be embodied by a switching transistor, the integrating capacitance (3.n) being connected in parallel therewith, between the inverting input terminal and the output terminal of the operational amplifier (2.n).

FIG. 1.1 shows an alternate embodiment of a light sensor circuit. In this circuit, the cathode electrode of a photodiode 111 is connected to the power source voltage $V_{DD}$, and the anode electrode of the photodiode 111 is connected to the inverting terminal of a differential amplifying circuit 115. A first reset transistor 116 and an integrating capacitance 117 are connected in parallel respectively, between the inverting terminal and the output terminal of the amplifying circuit 115. The differential amplifying circuit 115 is applied with a reference voltage $V_0'$ at the non-inverting terminal, and with a voltage $V_1'$, of the anode of the photodiode 111. Thus, the voltage $V_1'$, is made to be equal to the reference voltage $V_0'$ by the differential amplifying circuit 115. The output voltage $V_2'$ of the differential amplifying circuit 115 is fed to the inverting terminal of a comparator 114 through a transfer capacitance 118. Then the comparator 114 compares the input voltage $V_2'$ with a reference voltage $V_{ref}$, and outputs the compared result as a binary output voltage $S_1$.

In this optical sensing circuit, light irradiating photodiode 111 produces a photoelectric current flowing from the power voltage source $V_{DD}$ to the anode of the photodiode 111, and raises the input voltage $V_1'$, of the differential amplifying circuit 115.

Figure 5:
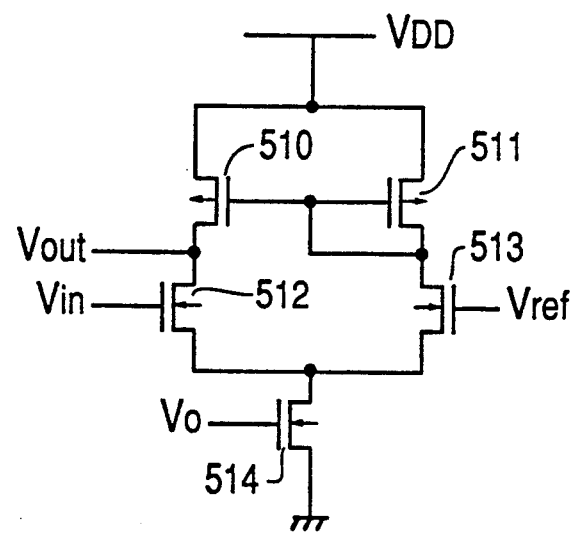
FIG. 5 is a circuit diagram showing the circuitry of a comparator using operational amplifiers constructed with CMOS transistors used in the light sensors shown in FIGS. 1 and 1.1.

Increasing the input voltage $V_1'$, causes a difference between the reference voltage $V_0'$ and the input voltage $V_1'$. The difference makes the differential amplifying circuit 115 operate to generate the output voltage $V_2'$ as shown in the following expression (1):

$$V_2' = A(V_1' - V_0') \tag{1}$$

where A is the amplification factor of the differential amplifying circuit 115. An example of the circuit configuration of the differential amplifying circuit is shown in FIG. 5 described later. With respect to the output voltage $V_2'$ in the embodiment of FIG. 1.1, while the input signal $S_{G1}$ is at level H and the first reset transistor 116 is turned on, the following expression (2) is satisfied:

$$V_2' = V_1' = V_0' \tag{2}$$

On the other hand, while the input signal $S_{G1}$ is at level L and the first reset transistor 116 is cut off, the following expression (3) is satisfied:

$$V_2' - V_1' = (-1/C_1) \cdot \int I \, dt \tag{3}$$

When the first reset transistor 116 is switched from the conductive state to the cut-off state at time $t=0$, the following expression (4) is satisfied:

$$V_1'(t=0) = V_0'/(1 - 1/A) \tag{4}$$

when the amplification factor $A \gg 1$, $$V_1'(t=0) = V_0'$$

If the photoelectric current I is constant, expression (3) can be expressed as follows:

$$V_2' = V_1' = -O \cdot t/C_1 \tag{5}$$

Combining expression (1) with expression (5), the following expressions (6) and (7) can be obtained:

$$V_2' = (V_0' - I \cdot t/C_1)/(A - 1/A) \qquad (6)$$

$$V_1' = V_0 + (V_0' - I \cdot t/C_1)/(A - 1) \qquad (7)$$

If $t=0$ in expression (7), expression (4) can be obtained. Moreover, if $A \gg 1$ in expressions (6) and (7), the following expressions (8) and (9) can be obtained respectively:

$$V_2' = V_0' - I \cdot t/C_1 \qquad (8)$$

$$V_1' = V_0' \qquad (9)$$

As is seen from expression (9), if the differential amplifying circuit 115 has a large amplification factor A, the voltage $V_1'$, of the anode of the photodiode 111 is always equal to the reference voltage $V_0'$. Thus, the reverse-biased voltage of the photodiode 111 is always equal to the constant value of $(V_{DD} - V_0')$. As a result, the junction capacitance is neither charged nor discharged based on the photoelectric current I of the photodiode 111 during integrating, and it is not required to consider the junction capacitance of the photodiode 111 in the integration. It is possible to make the variation of the output voltage larger by making the capacitance $C_1$ of the integrating capacitance 117 far smaller than a conventional one, which can improve the sensitivity of light detection. Moreover, since the constant reverse-biased voltage is always applied to the photodiode 111, the operation of the photodiode 111 is stable, and consequently the intensity of light can be converted into the photoelectric current with better accuracy.

Returning now to FIG. 1, the light sensors (10.1-10.n) are connected in parallel, the output switches (5.1-5.n) in each sensor being connected to a gate (8G) formed, for example, by an n-channel MOS transistor 8 as a source follower, which acts as a buffer circuit (11) having a resetting switch (7) to reset the output from each sensor. The output of this source follower is connected to an external circuit (12) via a further resetting switch (9). The switches (5.1-n, 6.1-n, 7 and 9) are driven by the signal received from a scanning circuit (13).

Figure 2:
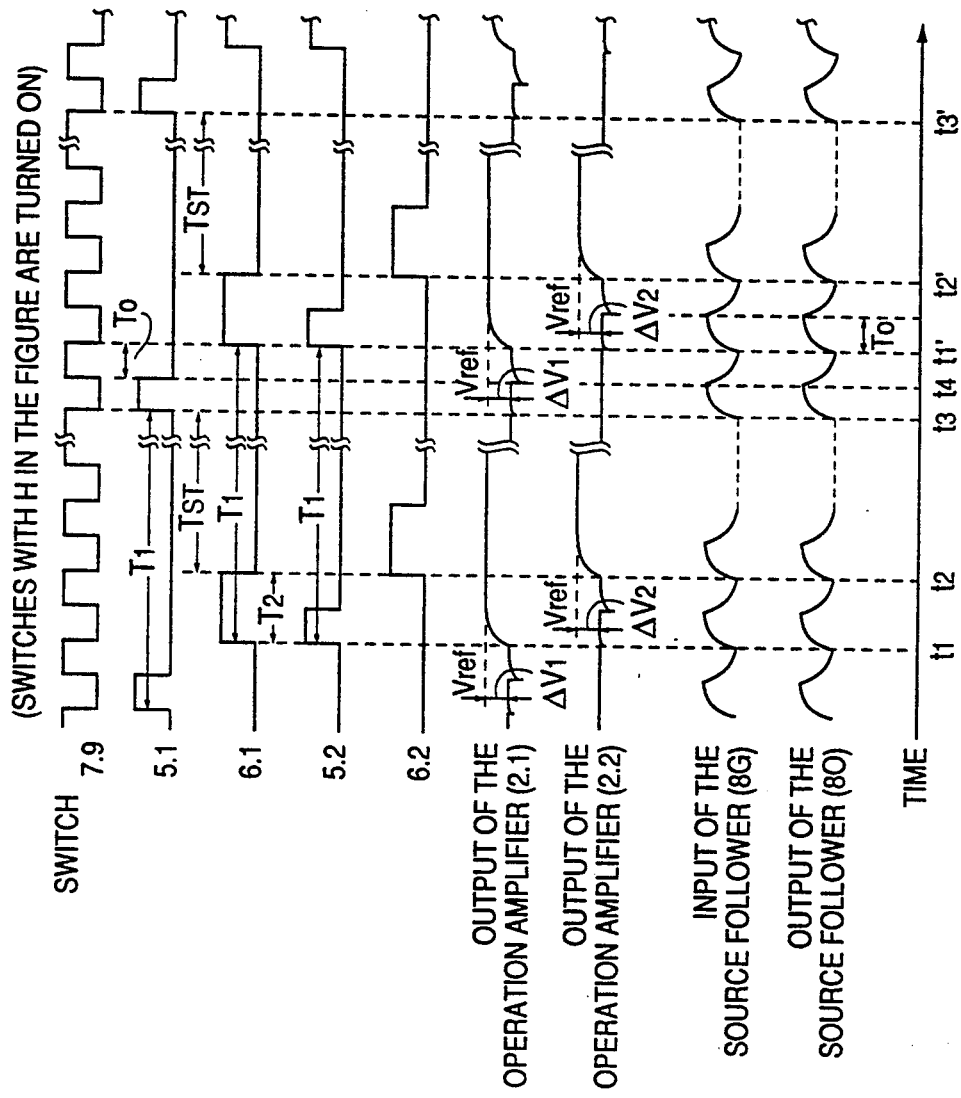
FIG. 2 is a timing chart that illustrates the operation of the light sensor device shown in FIG. 1.

FIG. 2 is a timing chart that illustrates the operation of the light sensor devices of FIG. 1. In this example, the resetting switch (7) connected to the gate input (8G) in the source follower (8), and the other end of the resetting switch (9) connected to the output (80) in the source follower (8) are each grounded, these switches (7 and 9) repeat a turn-on/turn-off operation at a time interval of TO. While these switches (7 and 9) are off, the output from each sensor is applied to the gate (8G), where a potential based on this output is output from the output (80) to the external circuit. The time to repeat the turn-on/turn-off operation need not be set at an equivalent interval, but rather may be set to the interval desired.

The output switch (5) in the sensor (10) turns on only for the time TO, and repeats the above operation with a time interval T1 as one cycle. The output of the sensor is supplied to the source follower (8) when the output switch (5) is on. Therefore, the output switches (5.1-5.n) of the sensors carry out the on-off operation with a time delay of 2×TO. That is at a time 2×TO after the output switch (5.1) in the sensor (10.1) have been turned on, the output switch (5.2) in the sensor (10.2) will turn on.

The output switch (6) in the sensor (10) turns on for the time T2, and repeats the above operation with a time interval T1 as one cycle. The operation timing for the resetting switches (6.1-n) in the sensors (10.1-n) is the same as explained above for the output switches (5.1-n).

The condition for these sensors that repeat the above operations is such that first the input and output of the operational amplifier (2.1) are short circuited by the resetting switch (6.1), which has been tuned on at time t1, whereas the input potential $V_{in}$ becomes equivalent to the output voltage $V_{out}$ of the operational amplifier (2), and is reset to the reference potential $V_{ref}$ which has been input into the noninverting input. That is, the following relational expression can be established on the potentials of the input and output of the operational amplifier (2):

$$V_{in} = V_{out} \qquad (10)$$

$$V_{out} = A (V_{ref} - V_{in}) \qquad (11)$$

From the expressions (10) and (11)

$$V_{in} = V_{ref}(1/(1 + 1/A)) \qquad (12)$$

where A is an amplification factor of the operational amplifier (2), and if the amplification factor A is larger than one, $V_{in}$ and $V_{out}$ are initialized to $V_{ref}$.

When the resetting switch (6.1) turns off at time t2, the operational amplifier (2.1) begins an accumulative action. That is, when the photodiode (1.1) detects a light, an electric charge is developed, the charge being accumulated in the integration capacitance (3.1). Therefore, a potential difference of $\Delta V$ is generated between the $V_{in}$ and $V_{out}$.

This condition continues for a time of $T_{st}$ until the output switch turns on at time t3. If it is assumed that a current $I_p$, corresponding to the light intensity flows from the photodiode 1.1 for this duration, the $\Delta V$ can be defined by the following expression:

$$\Delta V = V_{in} - V_{out} = I_p \times T_{st}/C \qquad (13)$$

where C is the capacitance value of the integration capacitance (3.1).

$V_{in}$ and $V_{out}$ in this condition can be expressed as follows from the expressions (11) and (13);

$$V_{out} = (V_{ref} - \Delta V)/(1 + 1/A) \qquad (14)$$

$$V_{in} = V_{ref} - (V_{ref} - \Delta V)/(A + 1) \qquad (15)$$

If in this case the amplification factor A is much larger than one, $$V_{out} = V_{ref} - \Delta V \qquad (16)$$

$$V_{in} = V_{ref} \qquad (17)$$

That is, the output potential $V_{out}$ of the operational amplifier drops by as much as $I_p \times T_{st}/C$ as a result of the current $I_p$ corresponding to the light intensity from the photodiode (1.1), and the input potential $V_{in}$ is maintained at $V_{ref}$.

When the output switch (5.1) turns on at time t3, the above output potential $V_{out}$ is output from the operational amplifier (2.1). Thus, the potential that the current $I_p$, corresponding to the light intensity has been converted to a voltage is output from the operational amplifier (2.1), this potential $V_{out}$ being applied to the gate (8G) in the source follower (8). The resetting switches (7 and 9) are off at this time. The buffer circuit (11) is used to reduce a load to the operational amplifier (2), for which an n-channel type FET is used as a source follower.

In this circuit (11), where the source potential, being the output (80) follows the gate potential, a potential is output that corresponds to the output from the light sensors (10.1-n) applied to the gate (8G). FIG. 2 also shows as an example of the output (80) from the source follower of the output waveforms when the capacitance is a load. The capacitances (4.1-n) corresponding to the gate capacitance of the source follower (8) are connected to the outputs of the sensors (10.1-n) to reduce the load to the operational amplifiers (2.1-n), while their other ends are grounded.

The resetting switches (7 and 9) turn on and the output switch (5.1) turns off at time t4. Therefore, the gate potential and the source potential of the source follower are reset to the ground potential. Then, at the time t1', the resetting switch (6.1) turns on in the light sensor (10.1) and begins a new cycle. Then in the next light sensor (10.2), the output switch (5.2) turns on, and the output from the light sensor (10.2) is applied to the gate (8G) since the resetting switches (7 and 9) in the source follower (8) have been turned off, and a potential is output, which is proportional to the light intensity detected by the sensor (10.2).

The operation of the optical sensing circuit of the present invention shown in FIG. 1.1 will now be described with reference to the timing chart shown in FIG. 2.1. First, the input signal $S_{G1}$ is set to level H so that the first reset transistor 116 is turned on, and hence the input voltage $V_1'$, and the output voltage $V_2'$ are set to the initial voltage $V_0'$. Secondly, the input signal $S_{G1}$ is changed to level L and the first reset transistor 116 is cut off. Then, the input voltage $V_1'$, of the differential amplifying circuit 115 tries to change based on the photoelectric current I of the photodiode 111, as shown in expression (7). The input voltage $V_1'$, however, deviates little from the initial voltage $V_0'$ because the amplification factor A is sufficiently large. The output voltage $V_2'$ of the differential amplifying circuit 115 changes based on the current fed from the photodiode 111 as shown in expression (6), and decreases with the lapse of time.

At this time $t_0$, since the input signal $S_{G2}$ is at level H, the second reset transistor 119 is in the conductive state, and the input voltage $V_3'$ of the comparator 114 is maintained at the initial voltage $V_0'$. When the input signal $S_{G2}$ is turned to level L at the time $t_1$ after a predetermined time has passed from time $t_0$, the second reset transistor 119 is cut off and the input voltage $V_3'$ to the comparator 114 follows the decrease of the output voltage $V_2'$ of the differential amplifying circuit 115. The change of the input voltage $V_3'$ can be expressed by the following expression (18):

$$V_3' = V_0' - I \cdot t / C_1 \qquad (18)$$

Before the second reset transistor 119 is cut off (time period from $t_0$ to $t_1$), the change of the output voltage $V_2'$ is not transferred to the comparator 114 and only charges the capacitance 118, because the input voltage $V_3'$ of the comparator 114 is maintained at the initial voltage $V_0'$ via the conductive second reset transistor 119 and only changes the capacitance 118.

Therefore, the influence of switching noise on the output voltage $V_2'$ when the first reset transistor 116 is cut off, exerts no effect on the input voltage $V_3'$ of the comparator 114, which enables the intensity of light to be detected with high accuracy. Moreover, the input voltage $V_3'$ is not affected by the offset voltage which may reside in the differential amplifying circuit 115. Thus, fluctuation of the offset voltage of the differential amplifying circuit 115 has no effect on the sensitivity to light. Consequently, uniformity of light sensitivity for various optical sensing circuits can be easily achieved.

If the input voltage $V_3'$ decreases to the predetermined reference voltage $V_{ref} \propto 0$ at the time $t_2$, the output voltage $S_1$ of the comparator 114 goes from level L to level H, and the reserve time ts (i.e., $t_s = t_2 - t_1$) from the cutting off of the reset transistor 119 to the turning on of the comparator 114 can be expressed as follows:

$$t_s = (V_0' - V_{ref}) \cdot C_1 / I \qquad (19)$$

Thus, the intensity of light can be calculated by measuring the reserve time $t_s$.

In the above optical sensing circuit, the reference voltage $V_0'$ fed to the non-inverting terminal of the differential amplifying circuit 115, equals the reference voltage $V_{ref}$ fed to the noninverting terminal of the differential amplifying circuit 115, equals the reference voltage $V_{ref}$ fed to the noninverting terminal of the comparator 114. However, these voltages may differ from each other.

Figure 3:
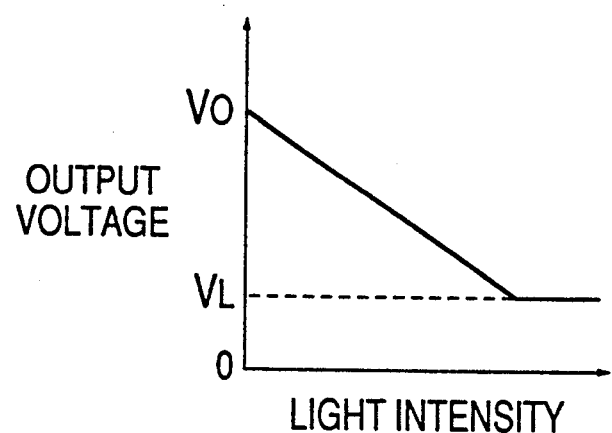
FIG. 3 is a graph showing the photoelectric transfer characteristics of the light sensor device of FIGS. 1 and 2.

FIG. 3 shows the photoelectric transfer characteristics of the device in FIG. 1. In this device, since the current I is zero when the light intensity is zero, the potential VO at this time is a value with the voltage drop $V_{th}$ in the source follower subtracted from $V_{ref}$. When the light intensity increases, so does the current $I_p$, the output potential from this light sensor being decreased in proportion with the light intensity. At the same time the linearity corresponding to the light intensity is ensured until the lower value $V_L$ determined from within the range of normal operational amplifier operation is reached. Thus, in this light sensor, the linearity is ensured in a region with a low light intensity, whereas such linearity has been difficult to ensure with conventional light sensors using phototransistors. This light sensor produces no difference in the response time even in a region with a low light intensity, and this therefore assures an operation with short read-out time.

Furthermore, the light sensor of this invention can secure a sufficient dynamic range because the difference between the potential VO and the lower limit $V_L$ is generally about 2 volts.

Figure 4:
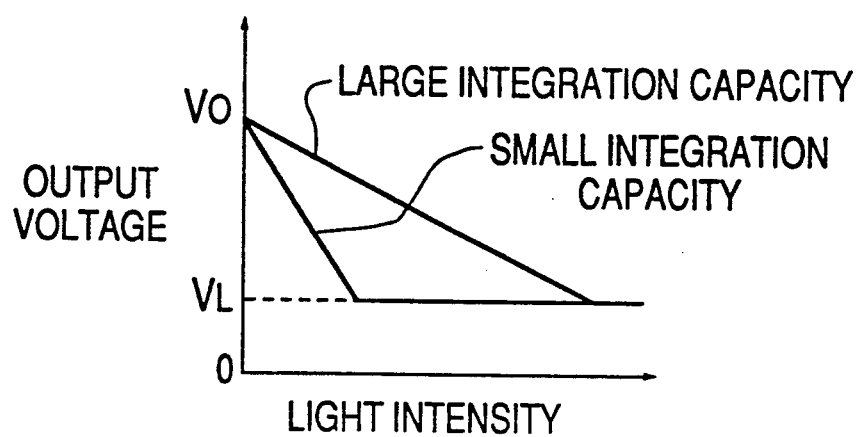
FIG. 4 is a graph explaining the changes in the photoelectric transfer characteristics of the light sensor shown in FIG. 1.

FIG. 4 shows how the photoelectric transfer characteristics of the present invention vary. Since the difference between the potential VO and the output voltage of the sensor according to the present invention is in inverse proportion to the integration capacitance, varying the values of the integration capacitance would enable easy adjustment of the sensor sensitivity. This would make it possible to provide low-priced light sensors according to their applications.

Furthermore, since a photoelectric current from the photodiode is accumulated in the integration capacitance, and is then output as an output voltage from the operational amplifier, the output side is not affected by the individual light sensor characteristics because of variance in the junction capacitance of the photodiode or any differences in the capacitance of the wiring from the diode to the amplifier. Furthermore, since the potential applied to the photodiode is maintained constant, the current generated from the light is all accumulated in the integration capacitance. Therefore, a potential difference proportional at all times to the photoelectric current from the photodiode can be obtained as an output, and problems such as variance in the sensitivity of the read-out device caused by variation in the read-out positions can be avoided.

FIG. 5 shows an example of operational amplifiers used in these light sensors constructed with CMCS transistors. The circuit shown in FIG. 5 is a comparator using CMOS transistors in which p-channel MOS (510, 511), and n-channel MOS transistors (512, 513) are arranged in parallel so that a current mirror circuit can be constructed between a power supply potential VDD and a ground potential. After both of these are connected, an n-channel MOS transistor (514) is provided to input a potential $V_{LMT}$, which can be used as a constant current source. The gates of the n-channel MOS transistors (512 and 513) are fed the input potential $V_{in}$ and the reference potential $V_{ref}$, respectively, the output potential $V_{out}$ being taken from between the p-channel MOS transistor (510) and the n-channel MOS transistor (512).

Figure 6:
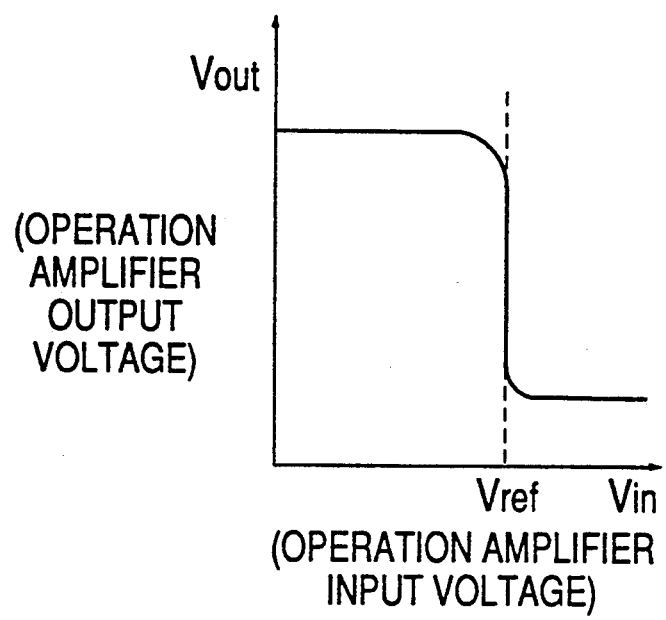
FIG. 6 is a graph showing the input/output operation characteristics of the operational amplifier comparator shown in FIG. 5.

FIG. 6 shows the input/output characteristics of this comparator. Since this light sensor device uses the integration circuit for an accumulation time $T_{at}$ of 0.1 m/sec to 10 m/sec, the operational amplifier need not be a high speed amplifier using bipolar elements; however, a comparator having the above-mentioned circuitry can be used to attain the required characteristics. Therefore, it is possible to manufacture this sensor device at a low cost.

In addition to the said operational amplifier, the resetting switches and other like parts can all be constructed with MOS transistors. Therefore, these can be assembled as various devices as in the case of the conventional light sensors using phototransistors.

EMBODIMENT 2

Figure 7:
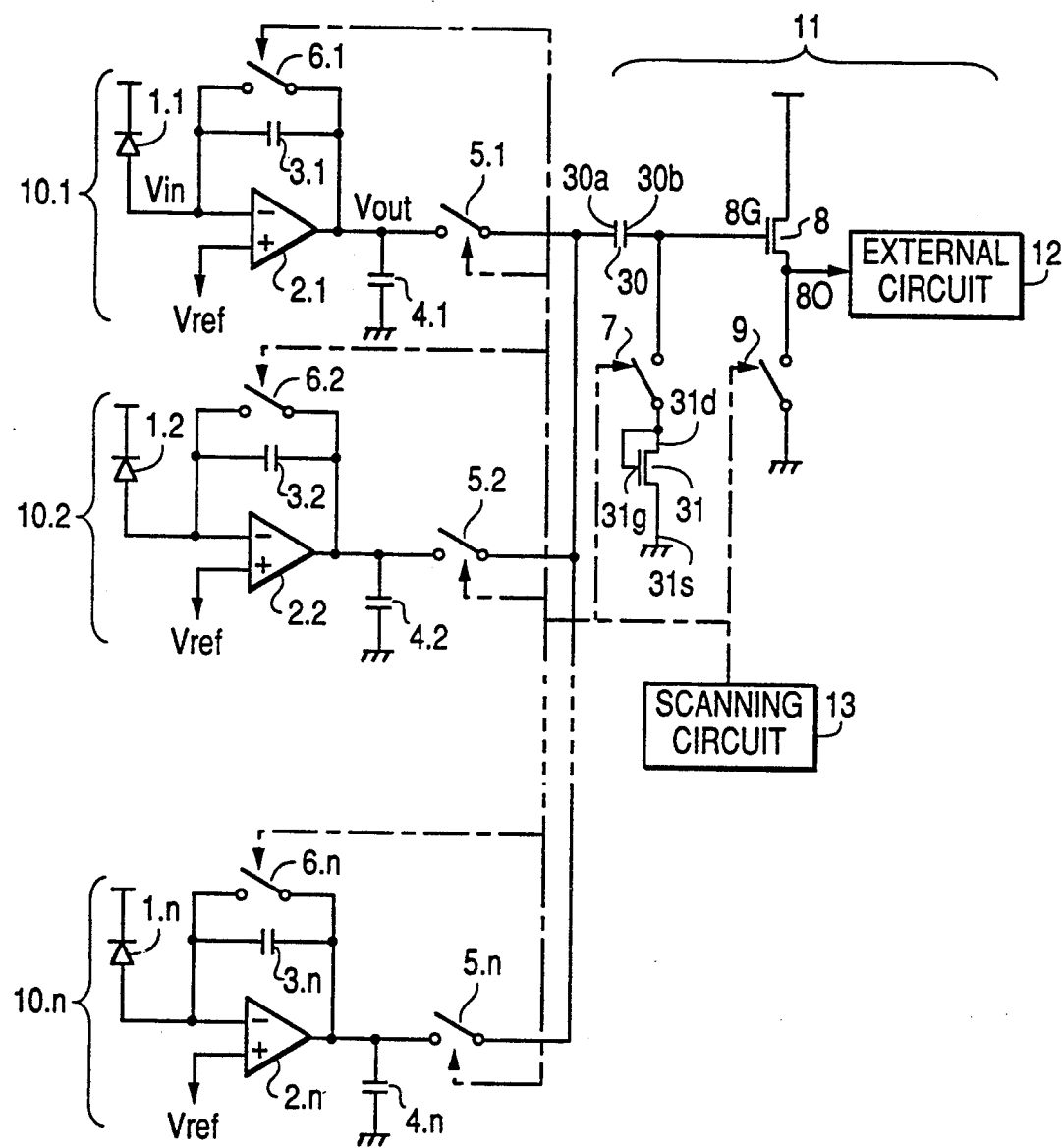
FIG. 7 is a circuit diagram showing the circuitry of the light sensor device according to Embodiment 2 of the present invention.

FIG. 7 shows the circuitry of the light sensor device according to another embodiment of the present invention. The sensor device of this example also comprises light sensors (10.1-10.n) consisting of "n" photodiodes (1). An individual light sensor (10) comprises a photodiode (1), an operational amplifier (2), into which the output from the photodiode (1) is input, an integration capacitance (3) connected in parallel with the operational amplifier (2) and a resetting switch (6), in the same manner as illustrated in FIG. 1 for Embodiment 1. Among these components, the parts common to Embodiment 1 are given the same numerals, and their explanation is omitted. This light sensor device has a transmission capacitance (30) inserted in a buffer circuit (11), into which the output from the light sensors (10.1-10.n) is sequentially input, at the site where each output from the light sensors is introduced. That is, the output potentials from the sensors (10.1-10.n) are selected by the output switches (5.1-5.n) in the sensors, and are applied to an input side (30a) of the transmission capacitance (30).

As a result, the transmission potential that appears on the output side (30b) of the transmission capacitance (30) is applied to the gate (8G) of the n-channel MOS device (8) used as a source follower for the buffer circuit (11). Furthermore, one end of the resetting switch (7) to initialize the potential of the output side (30b) is connected across the output side (30b) and the gate (8G). To the other end of this resetting switch (7) is connected an n-channel MOS device (31), with the same construction as the MOS device (8), as a source follower. Still further, since a gate electrode (31g) and a drain (31d) in the MOS device (31) are short circuited, the potential at the output side (30b) is set to the threshold potential $V_{th}$ of the MOS device (31), that is the threshold potential $V_{th}$ of the source follower (8), by means of the resetting switch (7).

Figure 9:
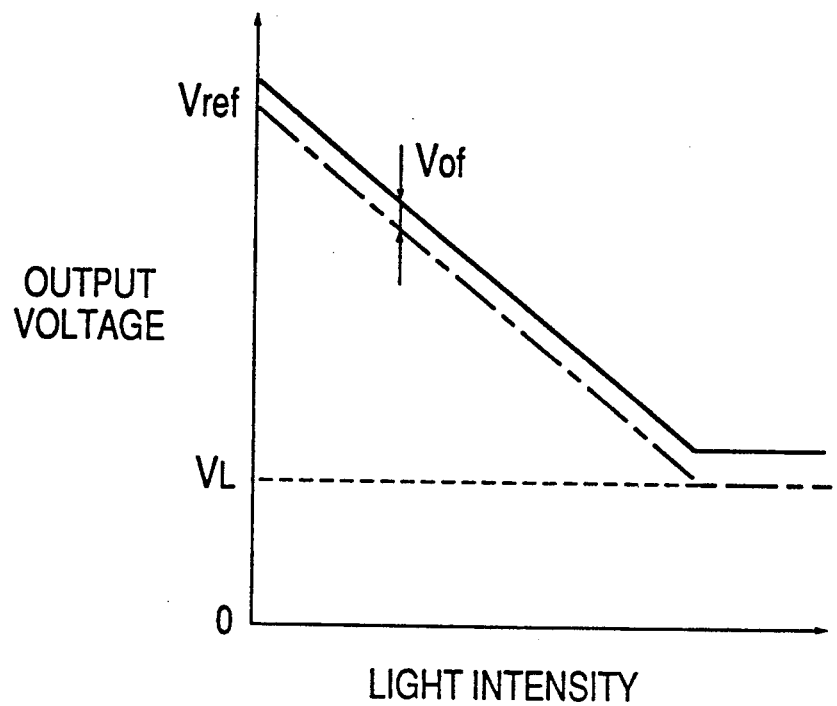
FIG. 9 is a graph showing the photoelectric transfer characteristics of the light sensor shown in FIG. 1.
Figure 16:
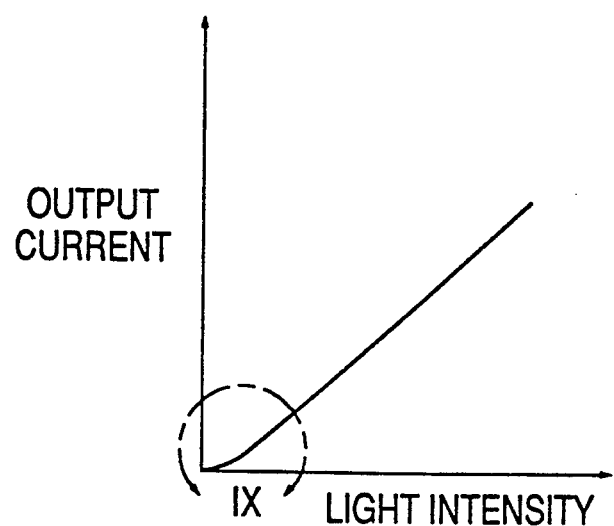
FIG. 16 is a graph showing the photoelectric transfer characteristics of the light sensor shown in FIG. 14.

As explained in Embodiment 1, by means of adopting the light sensor (10) using the photodiodes (1), operational amplifiers (2), integration capacitances (3), and resetting switches (6), a high-sensitivity light sensor device with assured linearity can be realized. It is common for each operational amplifier to have a very small offset potential. These small potentials may cause variance in the output potential from each light sensor in the low light intensity region. Therefore, to attain highly-defined and highly accurate image data, it is preferable for the influence of these offset potentials to be removed. In other words, as shown in FIG. 9, the reset initial potential $V_{in}$ at the light sensor will be as follows even if the reference potential $V_{ref}$ is input into the noninverting input to the operational amplifier, as a result of the offset potential $V_{of}$ inherent to each operational amplifier:

$$V_{int} = V_{ref} + V_{of} \quad (20)$$

Therefore, the output potential Vout from the light sensor as shown in the expression (16) will be, $$V_{out} = V_{ref} + V_{of} - \Delta V \quad (21)$$

where a potential shifted by as much as $V_{of}$ is output. This $V_{of}$ is very weak, but is inherent in each operational amplifier, and appears as a variance in the output from the light sensors. Therefore, by removing this offset potential $V_{of}$, a light sensor which assures linearity down to a region with very low light intensity and is even more accurate can be realized.

To do this, the present device has transmission capacitance (30) inserted in the buffer circuit (11). And this transmission capacitance (30) is used to cancel the offset potentials $V_{of0}1$ to $V_{of0}n$. Furthermore, the present device enables potentials proportional to the light intensities to be output from the buffer circuit (11) by obtaining the potential variation upon initializing the sensors (10.1-10.n) via the transmission capacitance (30). This makes the device of this example easier to operate as it can output higher signals when the light intensity is higher, as in the case of conventional light sensors.

Figure 8:
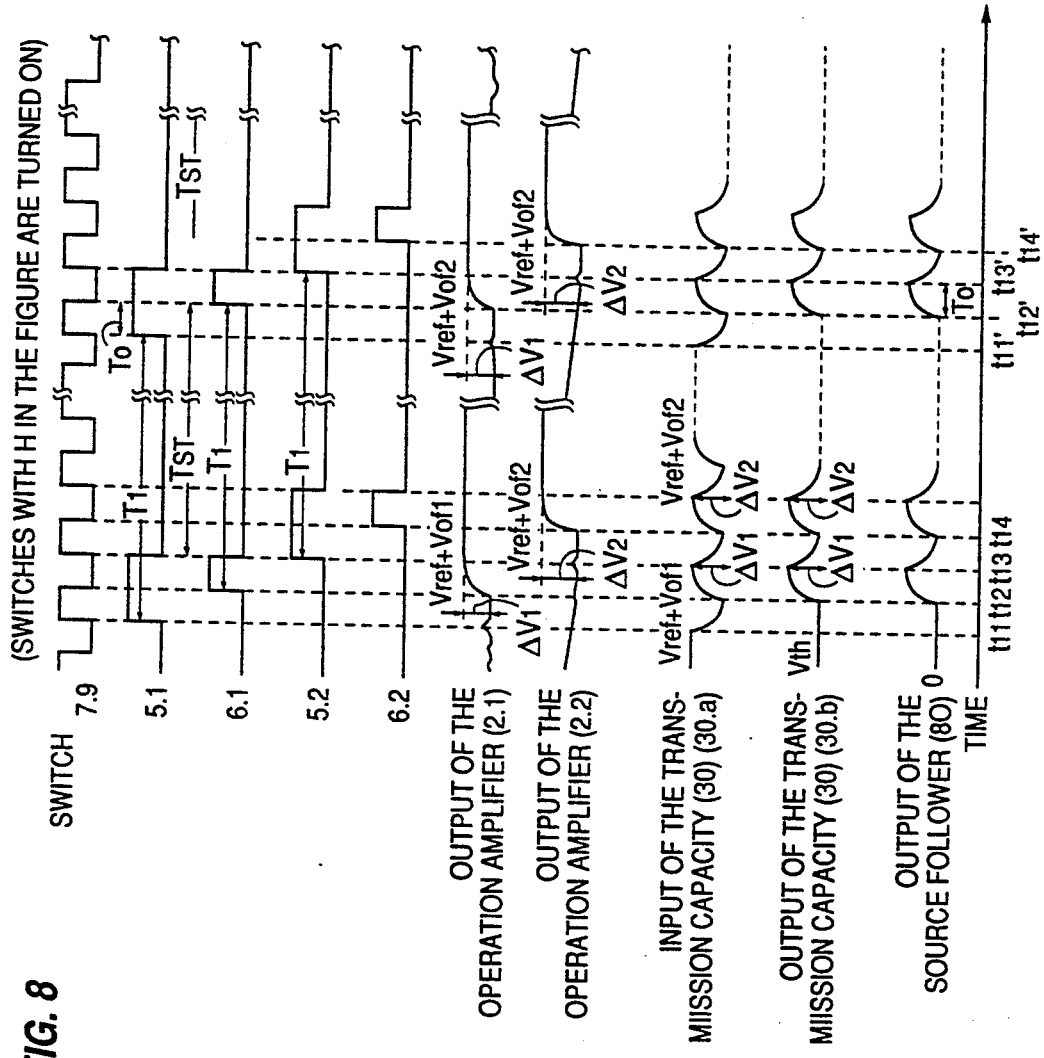
FIG. 8 is a timing diagram illustrating the operation of the light sensor device shown in FIG. 7.

Next, explanations are provided about the operation of each part of the present device referring to the timing chart in FIG. 8.

Also in the device of this embodiment, the switches (7 and 9) repeat turn-on/off operations on a pulse with a time interval of TO, as in Embodiment 1. Therefore, when these switches (7 and 9) are off, the output from each sensor is applied to the gate (8G) via the transmission capacitance (30), and potentials based on this application are output to an external circuit from the output (80). The timing of these turn-on/off operations need not be limited to timing having an identical time interval, but rather the time interval may be set as required, as in Embodiment 1. Also, as in Embodiment 1, the switch (5) and resetting switch (6) in the light sensors are driven at time T1 as a cycle. In the present device, the output switch (5) is first turned on to transmit potential variation to the buffer circuit (11) when the light sensors (10.1-10.n) are initialized. Moreover, the potential on the input side (30a) of the transmission capacitance (30) is initialized to a value at which the light intensities are converted into voltages at the light sensors (10.1-10.n). Then, after a lapse of time TO, the resetting switch (6) is turned on for the time TO while the output switch (5) remains on, to initialize the output potential in the light sensors. Simultaneously, the potential at the input side (30a) of the transmission capacitance rises as much as the light intensity converted into voltage. Thereafter, that is after a lapse of the time TO×2 following the output switch (5) being turned on, the output switch (5) is turned off, the light sensor resumes its measurement of light intensity, while the next light sensor is connected to the buffer circuit.

These operations are explained in time sequence. At time t11, the output switch (5.1) is turned on, and the light sensor (10.1) is selected. At time t11, the output potential $V_{out}1$ at the light sensor (10.1) is as follows from the expression (21):

$$V_{out}1 = V_{ref} + V_{ofo}1 - \Delta V1 \tag{22}$$

where $V_{ofo}1$ is an offset potential inherent to the light sensor (10.1), and $\Delta V1$ is a value of the light intensity sensed by the light sensor (10.1) shown in the expression (13) converted into a potential. Since the output switch has been turned on, the potential at the input side of the transmission capacitance (30) is set to $V_{out}1$. Then, the potential at the output side (30b) of the transmission capacitance (30) is set to the threshold potential $V_{th}$ of the source follower (8) via the MOS device (31), since the resetting switch (7) is turned on.

Next, at time t12, when the resetting switch (6.1) of the light sensor (10.1) is turned on, the output of the operational amplifier (2.1) is initialized to the reference voltage. Since an offset potential is present at each operational amplifier at this time as described earlier, the output of the operational amplifier (2.1), that is, the output of the light sensor (10.1) is reset to:

$$V_{out}1' = V_{ref} + V_{of}1 \tag{23}$$

Simultaneously, the input side (30a) of the transmission capacitance is also set to $V_{out}1'$. Therefore, the potential at the input side (30a) rises by $\Delta V1$ as can be understood from the expressions (22) and (23). Since the resetting switch (7) is open, the potential $V_{tr}$ at the output side (30b) will become, in response to the potential variation, $$V_{tr} = V_{th} + \Delta V1 \tag{24}$$

Thus, the potential variation $V_{tr}$ output from the transmission capacitance (30) in this device is not affected by the offset potential of the light sensors. In the source follower (8) to which the potential variation $V_{tr}$ is applied, the output potential is zero since $V_{tr}$ is the threshold value $V_{th}$ at time t12. In addition, as the $V_{th} + \Delta V1$ is applied to the gate electrode at time t12, the potential, which has risen by as much as $\Delta V1$, is output from the source follower (8). Therefore, the output of this device is so constructed that a high potential is output when the light intensity is high, having output characteristics similar to those of conventionally used light sensor devices, thereby making the present device easy to insert into existing facsimile machines and other devices.

Furthermore, at time t13, when the output switch (5.1) is turned off and the output switch (5.2) is turned on, an accumulating operation starts at the operational amplifier (2.1) in the light sensor (10.1), as explained in the discussion of Embodiment 1. The buffer circuit (11) is applied with the output from the light sensor (10.2), and the input side (30a) of the transmission capacitance is set to the output potential $V_{out}2$ of the light sensor (10.2) shown below:

$$V_{out}2 = V_{ref} + V_{of}2 - \Delta V2 \tag{25}$$

Then at time t14, when the output potential of the light sensor (10.2) is reset, the potential at the input side (30a) of the transmission capacitance rises as in expression (23) and becomes:

$$V_{out}2' = V_{ref} + V_{of}2 \tag{26}$$

Therefore, on the transmission potential $V_{th}$ at the output side (30b) of the transmission capacitance reset again to $V_{th}$ at time t13, these appear:

$$V_{tr} = V_{th} + \Delta V2 \tag{27}$$

This makes the source follower (8) output $\Delta V2$.

These operations are repeated for the light sensors (10.1-10.n) with time T1 as one cycle in the present device, which enables image data to be input continuously.

To explain, at time t11' after time T1 from time t11, the output switch (5.1) in the light sensor (10.1) is turned on again, and the light accumulated from time t13 is converted into a potential and transmitted to the buffer circuit (11). Also at times t12', t13' and t14' after the time T0 from the times t12, t13 and t14, operations at times t12, t13 and t14 are repeated.

Thus, in the device according to this embodiment, a potential variation where there is no influence from the offset potential can be extracted from the output of each light sensor by inserting the transmission capacitance into the buffer circuit. Therefore, the influence of a very small offset potential inherent to the operational amplifiers used in the light sensors can also be removed, thereby enabling the prevention of variance even with a very weak light intensity, and the output of the potential variation according to the light intensity. Thus, in the light sensor of this embodiment, linearity is maintained even in a low light intensity region, which is highly susceptible to the influence of the offset potential, and highly accurate image data without variance can be output. Moreover, since output signals that are at a higher level when the light intensity is higher can be output a- in the conventional devices, a device with high interchangeability, which is easy to use can be realized.

EMBODIMENT 3

Figure 10:
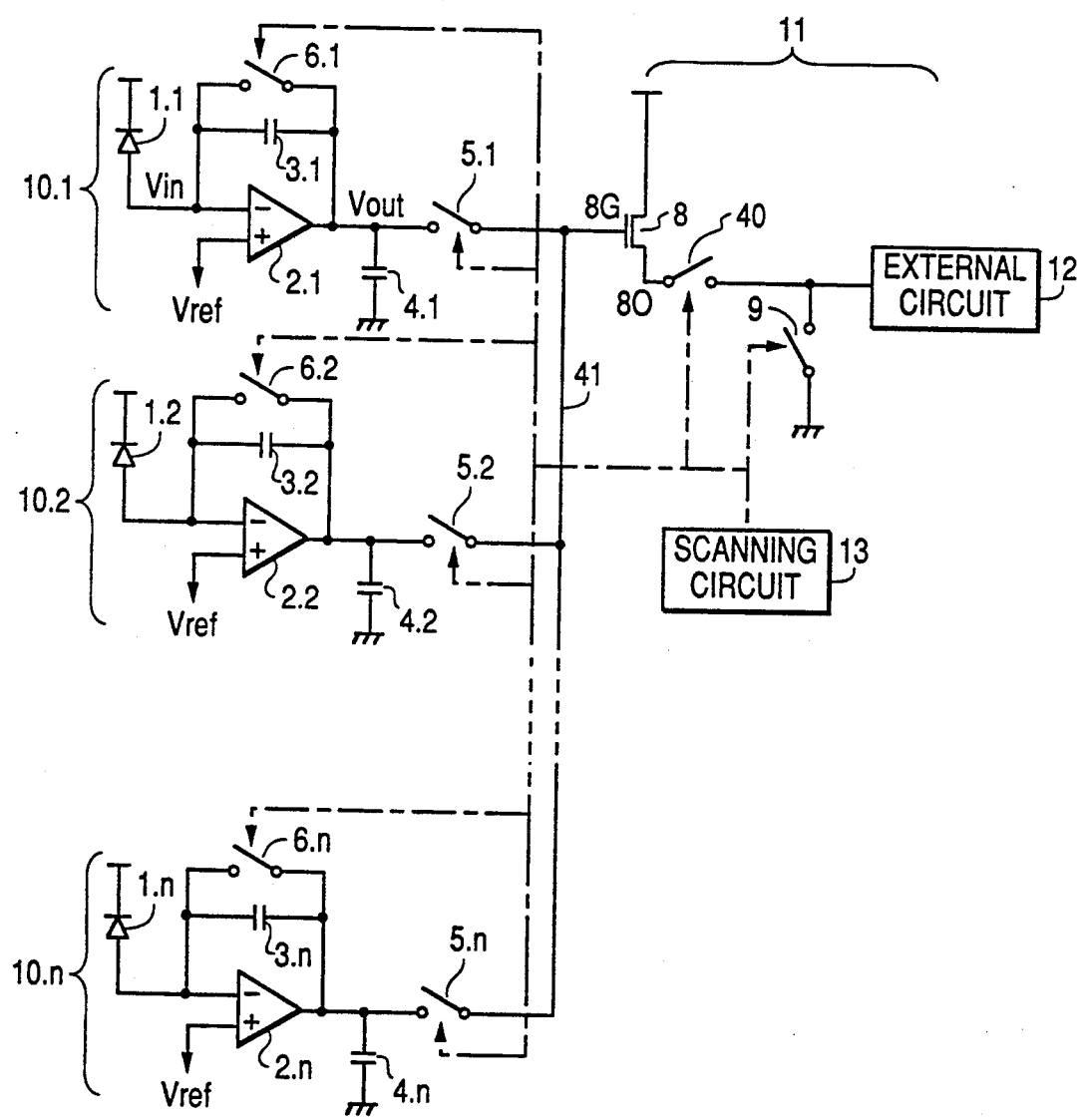
FIG. 10 is a circuit diagram showing the circuitry of the light sensor device according to Embodiment 3 of the present invention.

FIG. 10 shows the circuitry of the light sensor device according to a further embodiment of the present invention. This sensor device also consists of light sensors (10.1-10.n) comprising "n" photodiodes. An individual light sensor (10) comprises the photodiode (1), operational amplifier (2) into which the output of the photodiode (1) is input, integration capacitance (3) connected in parallel with the operational amplifier (2), and resetting switch (6) in the same manner as in Embodiment 1. The parts among these components that are common to those in Embodiment 1 are assigned the same numerals, and their explanations are omitted. This light sensor device is characterized in that the resetting switch (7) installed at the gate electrode (8G) in the source follower (8) converting the output impedance of the light sensors (10.1-10.n) is removed, by which output at even higher speeds is possible.

To prevent any confusion with the output for the next light sensor, the output side of the source follower (8) is reset to a lower potential by use of the resetting switch (9) after the output from the light sensors (10.1-10.n) has been transmitted. If at this time the output potential from the light sensors applied to the source follower (8) is in excess of the MOSFET threshold potential of the source follower (8), a large through-current can flow through the resetting switch, which can be a big problem in terms of power consumption. Therefore, the output side of the light sensor, that is, the gate potential at the source follower (8) is made low enough to prevent this through-current from flowing, by turning the resetting switch (7) on with the same timing as the resetting switch (9) on the output side of the source follower (8) is turned on.

Because the output switches (5.1-5.n) in the light sensors (10.1-10.n) are off when the resetting switches (7 and 9) are on, the potentials at the common line (41) and the gate electrode (8G) drop to zero volts. As a result, the operational amplifiers (2.1-2.n) of the light sensors (10.1-10.n) must charge the common line (41) from the output switches (5.1-5.n) to the gate electrode 8G of the source follower (8) each time the switches are turned on and off. The wiring capacitance of this common line (41) is about 1 pF, and the output potentials from the light sensors (10.1-10.n) grow from zero volts to as high as 2 or 3 V. For this reason, when the number of light sensors (10) contained in the light sensor device becomes large, the time required to charge a wire can no longer be disregarded.

Figure 13:
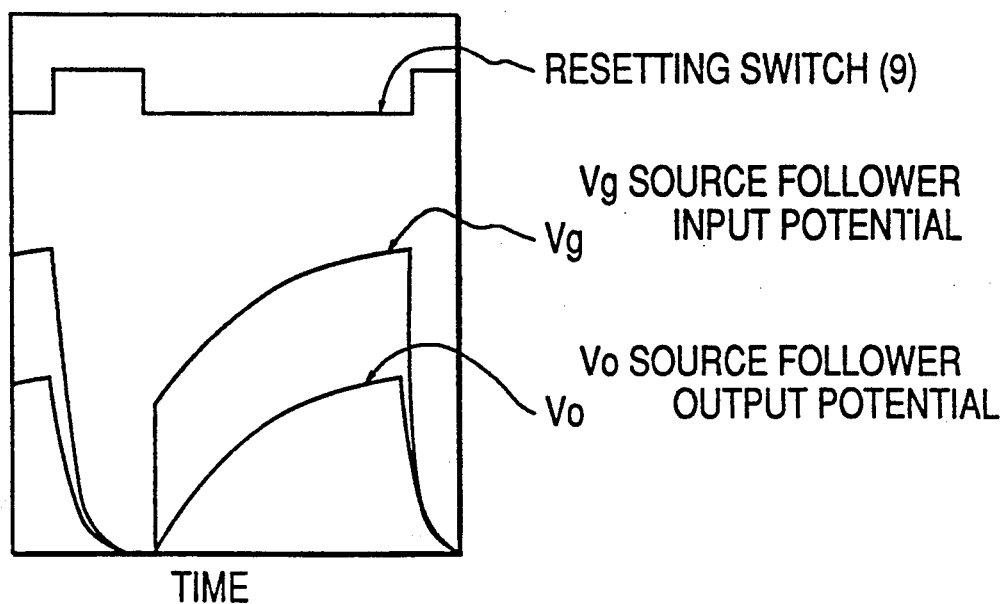
FIG. 13 is a graph showing the results of a simulation of time-based variations of the input potential and the output potential of the buffer circuit in the light sensor device shown in Embodiment 1 of FIG. 1.
Figure 14:
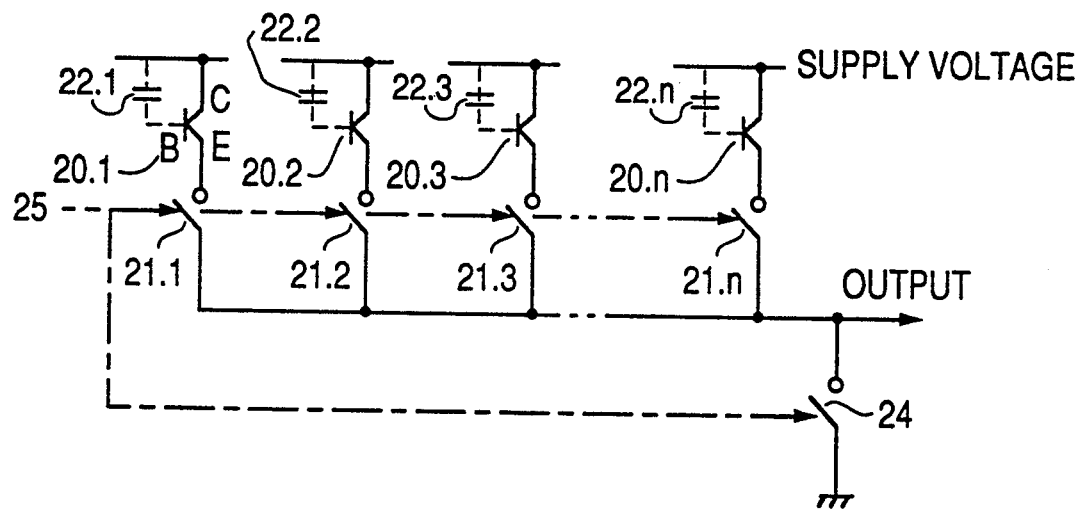
FIG. 14 is a circuit diagram showing the circuitry of a light sensor device that uses conventional phototransistors.
Figure 15:
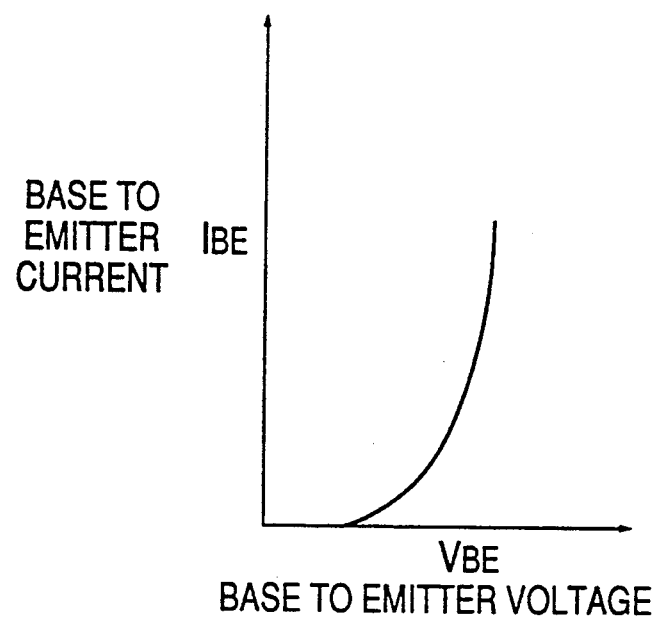
FIG. 15 is a graph explaining the operational characteristics of the phototransistors shown in FIG. 14.

FIG. 13 shows a simulation of the variation of the gate potential $V_g$ in the source follower (8) of the light sensor device shown in Embodiment 1, and the time aspect of the potential variation $V_o$. In this simulation the capacitance of the common line (41) is 1 pF, each transistor in the operational amplifier consists of a size of about several μm, while the clock frequency is 500 KHz. As can be seen from the figure, because the gate potential $V_g$ drops to zero volts each time the resetting switch is turned on, the output potential $V_o$ of the source follower (8) neither rises sharply, nor stabilizes easily.

Therefore, in this embodiment, for the output potential $V_o$ of the source follower (8) to rise faster, and thereby enable a high-speed action, the resetting switch on the gate electrode (8G) side is eliminated to prevent a drop in the gate potential $V_g$. Moreover, to prevent the through-current from flowing when the output side of the source follower (8) is reset, an interrupt switch (40) is provided at the output terminal (80) of the source follower (8). With this arrangement, the through-current can be prevented with the interrupt switch (40) turned off when the resetting switch (9), which resets the output side of the source follower (8) is turned on.

Figure 11:
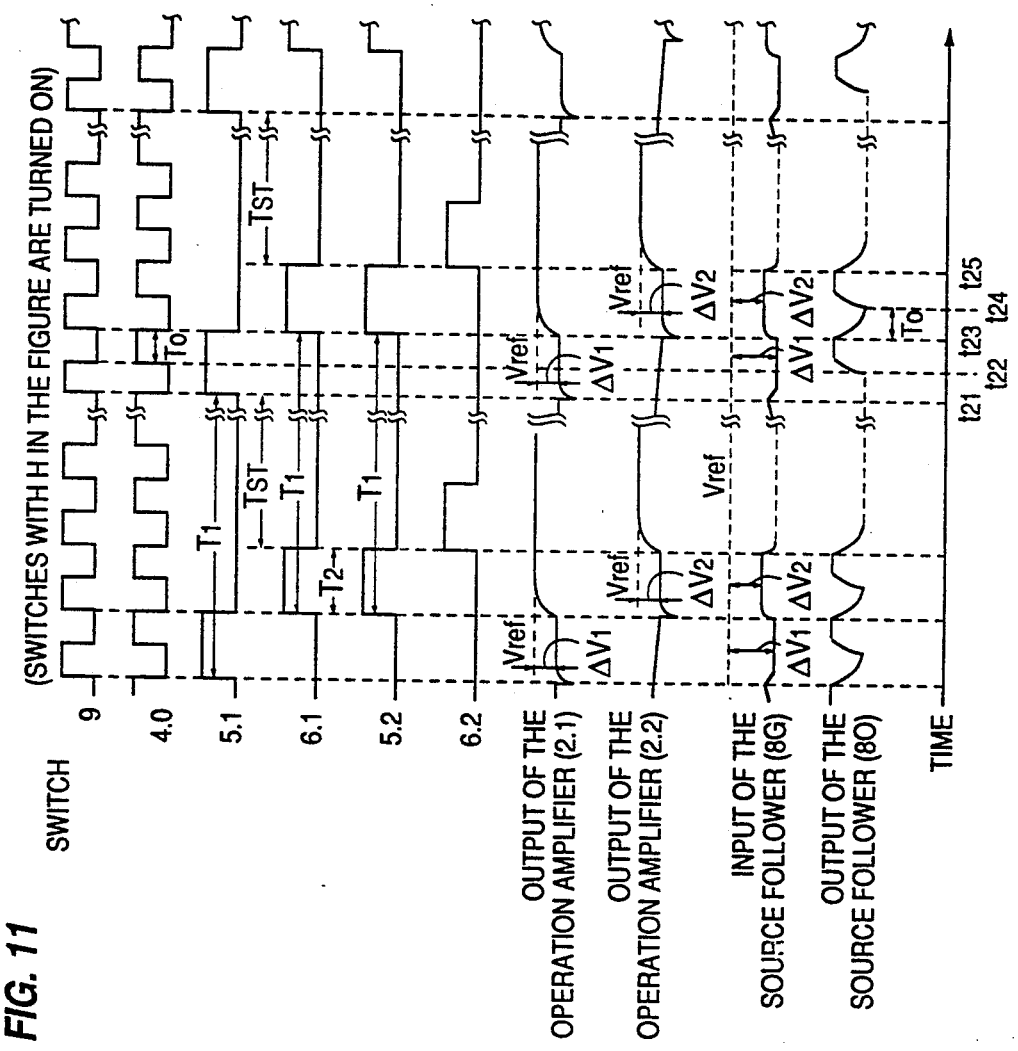
FIG. 11 is a timing chart illustrating the operation of the light sensor device shown in FIG. 10.

The operation of this device is explained according to the timing chart of this embodiment, shown in FIG. 11. Since the operation of the light sensors (10.1-10.n) and the output of the operational amplifiers are the same as those in Embodiment 1, their explanation is omitted. First, at time t21, when the output switch (5.1) is turned on, the potential at the common line (41), that is, the potential at the input (9G) of the source follower (8) becomes equivalent to the output potential at the operational amplifier (2.1) and a value lower by as much as $\Delta V1$ from the reference potential $V_{ref}$ is set as a gate potential for the source follower (8).

Simultaneously, the output side of the source follower is reset by turning on the resetting switch (9).

However, since the interrupting switch (40) installed at the output terminal of the source follower (8) is turned off, no through-current flows. Next, at time t22, when the resetting switch (9) is turned off, and the interrupt switch (40) is turned on, the gate potential available at that time, that is, the output potential corresponding to $\Delta V1$ appears on the output side of the source follower (80). At this time, unlike in Embodiment 1 shown in FIG. 2, the input potential at the source follower (8) has nearly the same potential as the output potential at the operational amplifier (2.1) at time t22, since the gate electrode (8G) in the source follower (8) has already been connected with the output of the operational amplifier (2.1) since time t21. Therefore, there is no time delay for charging the common line (41) and the gate electrode (8G), thus the output potential from the source follower (8) rises sharply, making it possible to increase the speed of this device.

Next, at time t23, the output switch (5.1) and the switch (40) are turned off, while the resetting switch (6.1) in the light sensor (10.1), the output switch (5.2) in the light sensor (10.2) and the resetting switch (9) are turned on. Therefore, the common line (41) and the gate-electrode (8G) in the source follower (8) are applied with the output $\Delta V2$ of the operational amplifier (2.2). Then, the output side of the source follower (8) is reset, but no through-current flows since the interrupt switch (40) has been turned off. Thus, in this embodiment, unlike in Embodiment 1, the output potential $\Delta V2$ of the operational amplifier (2.2) is directly applied to the common line (41) and the gate electrode (8G) from the output potential $\Delta V1$ of the operational amplifier (2.1). Therefore, compared with the device of Embodiment 1 in which the output potential $\Delta V2$ of the operational amplifier is applied after having once dropped to zero volts, the device of this embodiment has a smaller potential variation, and the gate potential at the source follower (8) can follow this variation easily. Furthermore, since the charge amount is small, the operational amplifier 2.2 consumes little power.

Next, at time t24, as the resetting switch (9) is turned off, and the interrupt switch (40) is turned on, the output potential corresponding to $\Delta V2$ of the operational amplifier (2.2) appears on the output side of the source follower. Since the light sensor (10.1) has, as in Embodiment 1, its resetting switch (6.1) turned off at time t25, it can complete resetting and resume the integration operation.

Figure 12:
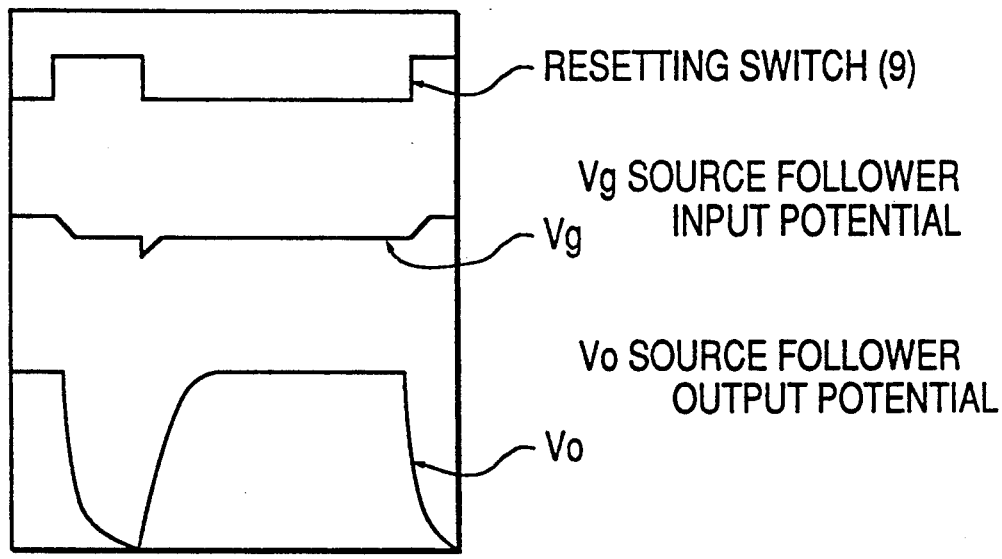
FIG. 12 is a graph showing the results of a simulation of time-based variations of the input potential and the output potential of the buffer circuit in the light sensor device shown in FIG. 10.

FIG. 12 shows a simulation of the variation of the gate potential $V_g$ in the source follower (8) in this Embodiment, and the time-based change in the potential variation $V_o$ on the output side of the source follower (8). In this simulation, as in the results of the simulation shown earlier, the capacitance of the common line (41) is 1 pF, each transistor in the operational amplifier is of a size of about several μm and the clock frequency is 500 KHz. As can be seen from the figure, unlike the results of the simulation shown in FIG. 13, the gate potential $V_g$ does not drop to zero volts, but is already at the predetermined potential when the resetting switch (9) is turned off, hence the output voltage $V_o$ can rise sharply, thereby providing a good output waveform.

Thus, in this embodiment, the through-current that would otherwise flow when the source follower is reset is eliminated by providing an interrupt switch at the output terminal of the source follower. Therefore, the gate potential can be set to the output potential of each sensor within a short time without having the gate potential at the source follower reset at zero volts every time each sensor is output. Moreover, it becomes possible to use the output potential at the next light sensor as the gate potential of the source follower, while the source follower is being reset; that is, the resetting switch on the output side of the source follower is turned on. Therefore, the output potential of the selected light sensor can be established to the gate potential of the source follower by the time the resetting of the output side of the source follower is completed, and the output potential corresponding to each light sensor is output. With this arrangement, the rising of an output signal from the source follower can be improved over the case of the device in Embodiment 1, in which the output potential of each light sensor is applied after the source follower has been reset. Thus, in this embodiment, since the output waveform from the source follower rises sharply and can become stabilized in a short time according to the value corresponding to the output potential of each light sensor, a light sensor device that can act even faster can be realized, even if there are a large number of light sensors.

Both this example and Embodiment 1 use photodiodes. Moreover, this device can be constructed with a variety of photodiodes, such as pin photodiodes or avalanche photodiodes.

As described above, the light sensor according to the present invention and the light sensor device that uses said light sensor, are characterized in that they output a power by converting into voltage the photoelectric current from a photoelectric transfer means such as photodiodes, using a differential amplifier and integration capacitance. Therefore, light sensors can be used even where light intensity is low, with the use of a photoelectric transfer means such as photodiodes in which linearity is maintained.

Furthermore, the sensor sensitivity can be readily adjusted by varying the integration capacitance value. Since the photoelectric current from the photodiodes is converted into voltage and is output using the differential amplifier, the influence on the sensitivity of the device attributable to individual photodiodes can be suppressed. Therefore, the sensor device according to the present invention can be constructed with little variance in sensitivity.

In addition, in the buffer circuit into which the light output potential integration signals from many light sensors is input sequentially, the influence of the offset potential inherent in operational amplifiers used for each light sensor can be removed by inserting a transmission capacitance to transmit the light output potential integration signal. For this reason, variance in sensitivity due to a very small offset potential can be prevented even in the case of low light intensity, thereby ensuring a light sensor device with even greater accuracy. Simultaneously, because the transmission capacitance is inserted, a light sensor device that supplies output signals that reach even higher levels when the light intensity is high, as in conventional light sensor devices, can be realized. Therefore, devices which can be easily interchanged with conventional light sensor devices and which are easy to operate can be provided.

Furthermore, the need to reset the input side of the output FET can be eliminated by providing an interrupting switch to prevent through-current from flowing when the output side of the output FET is reset, at the output terminal of the output FET which constitutes the buffer circuit. By this arrangement, it is possible to establish the light output potential integration signals of each light sensor as the gate potentials of the output FET before the output FET comes into an output condition. This enables the output signals from the output FET to rise sharply, thus realizing a light sensor device capable of acting at high speed.

In addition, the light sensor according to the present invention can be realized by circuits constructed with MOS transistors, so that the sensor can be formed as discrete elements or on one semiconductor substrate which includes the photodiodes. Therefore, it can be inserted into devices including facsimile machines in the same manner as can conventional light devices such as phototransistors.

It will be understood that the above description of the present invention is susceptible to various modifications, changes, and adaptations, and the same are intended to be comprehended within the meaning and range of equivalents of the appended claims.

We claim:

1. A light sensor apparatus comprising:
a plurality of light sensors, each of said plurality of light sensors comprising:
photoelectric transducer means for generating an electrical output signal according to input light intensity;
integrating means, operatively coupled to said photoelectric transducer means for receiving the electrical output signal therefrom, and for outputting an integration signal based on an electrical charge accumulated for a certain period of time; and
potential setting means, operatively coupled to said integrating means, for initializing the integration signal output by said integrating means;
wherein the integrating means comprises an differential amplification circuit having first and second inputs and an output, a predetermined reference voltage being applied to the first input, the electrical output signal from the photoelectric transducer means being applied to the second input, said potential setting means and an integration capacitance being connected in parallel between the second input and the output of the differential amplification circuit;
wherein said apparatus further comprises:
a plurality of output switches, each of said output switches having one end connected to receive output from a respective differential amplification circuit, each of said output switches having other ends interconnected together; and
a scanning circuit for scanning each of said potential setting means and each of said output switches in sequence.

2. A light sensor as claimed in claim 1, wherein the photoelectric transducer means comprises a photodiode.

3. A light sensor as claimed in claim 1, wherein the differential amplification circuit comprises a CMOS circuit.

4. A light sensor as claimed in claim 1, wherein the differential amplification circuit comprises a CMOS comparator.

5. A light sensor as claimed in claim 1, wherein the potential setting means comprises a switch circuit connected in parallel across the second input and the output of the differential amplification circuit.

6. A light sensor device including a plurality of light sensors, each light sensor comprising:
   photoelectric transducer means for generating an electrical output signal according to input light intensity;
   integrating means, operatively coupled to said photoelectric transducer means for receiving the electrical output signal therefrom, and for outputting an integration signal based on an electrical charge accumulated for a certain period of time; and
   potential setting means, operatively coupled to said integrating means, for initializing the integration signal output by said integrating means;
   wherein the integrating means comprises a differential amplification circuit having first and second inputs and an output, a predetermined reference voltage being applied to the first input, the electrical output signal from the photoelectric transducer means being applied to the second input, said potential setting means and an integration capacitance being connected in parallel between the second input and the output of the differential amplification circuit
   wherein said light sensor device further includes:
   a buffer circuit into which the integration output signals from the plurality of light sensors are input sequentially, wherein this buffer circuit includes at least one output FET, the integration output signals being applied to a gate electrode thereof.

7. A light sensor device including a plurality of the light sensors, each light sensor comprising:
   photoelectric transducer means for generating an electrical output signal according to input light intensity;
   integrating means, operatively coupled to said photoelectric transducer means for receiving the electrical output signal therefrom, and for outputting an integration signal based on an electrical charge accumulated for a certain period of time; and
   potential setting means, operatively coupled to said integrating means, for initializing the integration signal output by said integrating means;
   wherein the integrating means comprises a differential amplification circuit having first and second inputs and an output, a predetermined reference voltage being applied to the first input, the electrical output signal from the photoelectric transducer means being applied to the second input, said potential setting means and an integration capacitance being connected in parallel between the second input and the output of the differential amplification circuit
   wherein said light sensor device further includes:
   wherein said light sensor device further includes:
   a buffer circuit into which the integration output signals from the plurality of light sensors are input sequentially, wherein this buffer circuit includes transfer potential initializing means for initializing a transfer capacitance into which the integration output signals are input, and for initializing a transfer potential created at the output of this transfer capacitance.

8. A light sensor as claimed in claim 7, wherein the transfer potential initializing means comprises potential converting and initializing means, for initializing the transfer potential prior to initialization of the integration output signals.

9. A light sensor as claimed in claim 7, wherein the buffer circuit includes at least one output FET, the transfer potential being applied to a gate electrode thereof, and wherein the transfer potential initializing means is a threshold potential setting means for initializing the transfer potential to a threshold potential in the at least one output FET.

10. A light sensor as claimed in claim 9, wherein the threshold potential setting means comprises a potential setting FET with the same configuration as the at least one output FET, and wherein the drain of the potential setting FET is short-circuited with the gate electrode thereof.

11. A light sensor as claimed in claim 6, further comprising an output potential resetting means for initializing the potential on the output side of the output FET.

12. A light sensor as claimed in claim 11, further comprising switching means, disposed at the output end of the output FET, for interrupting a through-current while the output potential resetting means is operating.

* * * * *